United States Patent
Burr

(10) Patent No.: US 6,249,027 B1
(45) Date of Patent: Jun. 19, 2001

(54) PARTIALLY DEPLETED SOI DEVICE HAVING A DEDICATED SINGLE BODY BIAS MEANS

(75) Inventor: James B. Burr, Foster City, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/092,974

(22) Filed: Jun. 8, 1998

(51) Int. Cl.$^7$ .................................................. H01L 27/04
(52) U.S. Cl. ........................ 257/350; 257/347; 257/358; 257/359; 257/59; 257/299
(58) Field of Search ..................................... 257/347, 355, 257/59, 369, 351, 348, 349, 350, 328

(56) References Cited

U.S. PATENT DOCUMENTS

| | | | |
|---|---|---|---|
| 4,062,699 | 12/1977 | Armstrong | 148/1.5 |
| 4,173,818 | 11/1979 | Bassous et al. | 29/571 |
| 4,208,780 | 6/1980 | Richman | 29/571 |
| 4,939,571 | 7/1990 | Nishizawa et al. | 357/23.3 |
| 4,949,140 | 8/1990 | Tam | 357/23.5 |
| 5,031,008 | 7/1991 | Yoshida | 357/23.3 |
| 5,294,821 | 3/1994 | Iwamatsu | 257/351 |
| 5,359,219 | 10/1994 | Hwang | 257/351 |
| 5,429,958 | 7/1995 | Matlock | 437/34 |
| 5,486,480 | 1/1996 | Chen | 437/29 |
| 5,536,959 | 7/1996 | Kellam | 257/327 |
| 5,557,231 | * 9/1996 | Yamaguchi et al. | 257/66 |
| 5,559,368 | * 9/1996 | Hu et al. | 257/351 |
| 5,565,377 | 10/1996 | Weiner et al. | 437/173 |
| 5,605,855 | 2/1997 | Chang et al. | 437/45 |
| 5,616,944 | 4/1997 | Mizutani et al. | 257/365 |
| 5,641,980 | 6/1997 | Yamaguchi et al. | 657/347 |
| 5,650,340 | 7/1997 | Burr et al. | 437/30 |
| 5,712,501 | 1/1998 | Davies et al. | 257/335 |
| 5,744,994 | 4/1998 | Williams | 327/374 |
| 5,753,958 | 5/1998 | Burr et al. | 257/392 |
| 5,773,863 | 6/1998 | Burr et al. | 257/344 |
| 5,811,857 | * 9/1998 | Assaderaghi et al. | 257/355 |
| 5,854,561 | * 12/1998 | Arimoto et al. | 327/534 |
| 5,923,067 | 7/1999 | Voldman | 257/349 |

OTHER PUBLICATIONS

Minimization of Threshold Voltage Variation in SOI Mosfets, Sherony et al9, 1994.*

* cited by examiner

Primary Examiner—Fetsum Abraham
(74) Attorney, Agent, or Firm—Gunnison, McKay & Hodgson, L.L.P.; Philip J. McKay

(57) ABSTRACT

A conductive body contact or layer is embedded in the bulk region of a partially depleted SOI device. The contact or layer is connected to the output of a bias voltage generator which generates a substrate bias voltage. The substrate bias voltage is routed to the bulk by way of the contact or layer to bias the threshold voltage of the partially depleted SOI device.

12 Claims, 3 Drawing Sheets

PARTIALLY DEPLETED SOI DEVICE HAVING A DEDICATED SINGLE BODY BIAS MEANS

BACKGROUND OF THE INVENTION

1. Field of the Invention

The present invention generally relates to semiconductor devices, and in particular, the present invention relates to partially depleted silicon-on-insulator (SOI) devices which include a mechanism for tuning the threshold voltage thereof.

2. Description of the Related Art

The partially depleted SOI device is a MOS transistor formed in a monocrystalline silicon substrate sitting above an insulating oxide layer, called a back oxide. The source/drain regions usually penetrate down to the back oxide. The channel region between the source and drain is doped so that the depletion region under the gate does not extend to the back oxide. This is the important difference between partially depleted and fully depleted SOI devices.

Silicon-on-insulator (SOI) devices are thus characterized by structures in which the Si device layers are formed over an insulating film. FIG. 1 illustrates an exemplary configuration of such a device.

The device of FIG. 1 includes an nfet 102 and a pfet 104 formed within a layer 106. The layer 106 is located along an oxide layer 108 formed atop a p+ bulk material 110. The nfet 102 includes source and drain n-regions 112 and 114, a p-region 116, and a gate electrode 118. Likewise, the pfet 104 includes source and drain p-regions 120 and 122, an n-region 124, and a gate electrode 126. SOI devices of this type are characterized by low parasitic capacitances, as well as high dielectric isolation of the on-chip components.

A "fully depleted" SOI device is shown in FIG. 2. Here, the device is configured such that the depletion regions 228 extend completely down to the interface with the oxide layer 208. This is done, for example, by making the layer 206 much thinner than the corresponding layer 306 of the partially depleted device shown in FIG. 3 and discussed below. The structure is otherwise similar to that of the partially depleted device, and includes an nfet 202 having source and drain n-regions 212 and 214, a p-type channel region 216, and a gate 218, and a pfet 204 having source and drain p-regions 220 and 222, an n-type channel region 224, and a gate 226. The substrate 210 is tied to a fixed potential such as ground.

A "partially depleted" SOI device refers to a structure in which the depletion region of the transistors does not extend all the way down to the oxide layer. An example of this is shown in FIG. 3. Here, the layer 306 is of sufficient thickness and the n-regions 312 and 314 are appropriately configured (e.g., through use of source-drain extensions) such that the depletion region 328 is spaced from the upper surface of the oxide layer 308, i.e., only a portion of the p-region 316 is depleted.

The non-depleted region between the source 312 and drain 314 is called the body or bulk. In conventional partially depleted SOI, the body is left floating or is connected to the source of the transistor. In another alternative, known as dynamic threshold MOS (DTMOS), the body is connected to the gate. This causes the threshold to be higher when the device is off than when it is on, which decreases the off-state leakage and increases the on-state current. Referring again to FIG. 3, a body contact 330 is embedded in the p-region 316, below the depletion region 328. Also, as shown, the body contact 330 is electrically tied to the gate electrode 318. As such, when the gate potential is turned on, the potential of the p-region 316 below the depletion region 328 (i.e., the "bulk region") is pulled up, whereby the bulk potential of the device tracks the gate potential. This results in a forward biasing of the bulk which in turn decreases the threshold voltage of the device.

There are a number of factors which contribute to the magnitude of an SOI device's threshold voltage. For example, to set a device's threshold voltage near zero, light doping and/or counter doping in the channel region of the device may be provided. However, due to processing variations, the exact dopant concentration in the channel region can vary slightly from device to device. Although these variations may be slight, they can shift a device's threshold voltage by a few tens or even hundreds of a millivolt. Further, dimensional variations, charge trapping in the materials and interfaces, and environmental factors such as operating temperature fluctuations can shift the threshold voltage. Still further, low threshold devices may leak too much when their circuits are in a sleep or standby mode. Thus, particularly for low-threshold devices, it is desirable to provide a mechanism for tuning the threshold voltage to account for these and other variations.

SUMMARY OF THE INVENTION

It is an object of the present invention to provide a partially depleted SOI device which includes a mechanism for tuning the threshold voltage of the device to account for variations in process, temperature and circuit activity.

To achieve the above and other objects and advantages, according to one aspect of the present invention, a semiconductor device includes a partially depleted SOI device which includes a semiconductor substrate, an insulating layer formed along a surface of the semiconductor substrate, and a transistor formed on the insulating layer such that the insulating layer is interposed between the transistor and the semiconductor substrate. The transistor includes source and drain regions of a first conductivity type formed on the insulating layer, an intermediate region of a second conductivity type formed on the insulating layer and between the source and drain regions, and a gate electrode aligned over the intermediate region. The intermediate region includes a depletion region defining a channel of the transistor and a non-depletion region defining a bulk of the transistor. First, second, third and fourth terminals are electrically coupled to the source region, drain region, gate electrode and bulk, respectively. The semiconductor device further includes a bias voltage generator having a bias voltage output which is coupled to the fourth terminal and isolated from the first through third terminals.

According to another aspect of the invention, the semiconductor device further includes a conductive body contact embedded in the bulk and connected to the fourth terminal.

According to still another aspect of the invention, the semiconductor device further includes a conductive layer of the second conductivity type contained within the bulk and connected to the fourth terminal.

According to yet another aspect of the invention, the bias voltage generator may be located off-chip.

DETAILED DESCRIPTION OF THE PREFERRED EMBODIMENTS

The invention is at least partially characterized by connecting the body of the partially depleted SOI device to a separate potential so that the threshold voltage of the device can be adjusted to compensate for variations in process, temperature and circuit activity.

Figure 1:
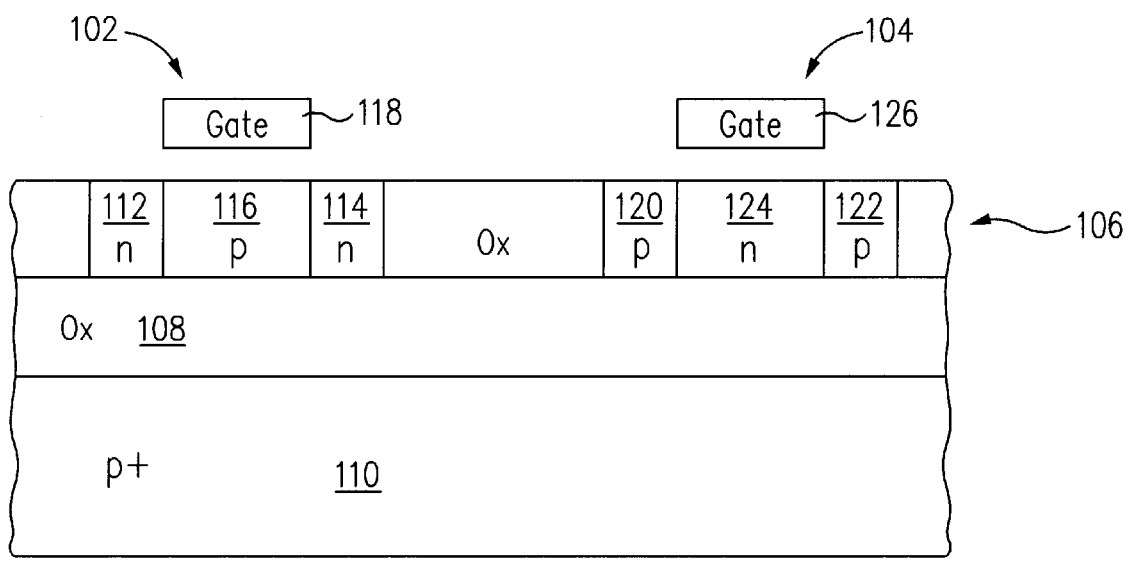
FIG. 1 depicts a typical silicon-on-insulator (SOI) configuration.
Figure 2:
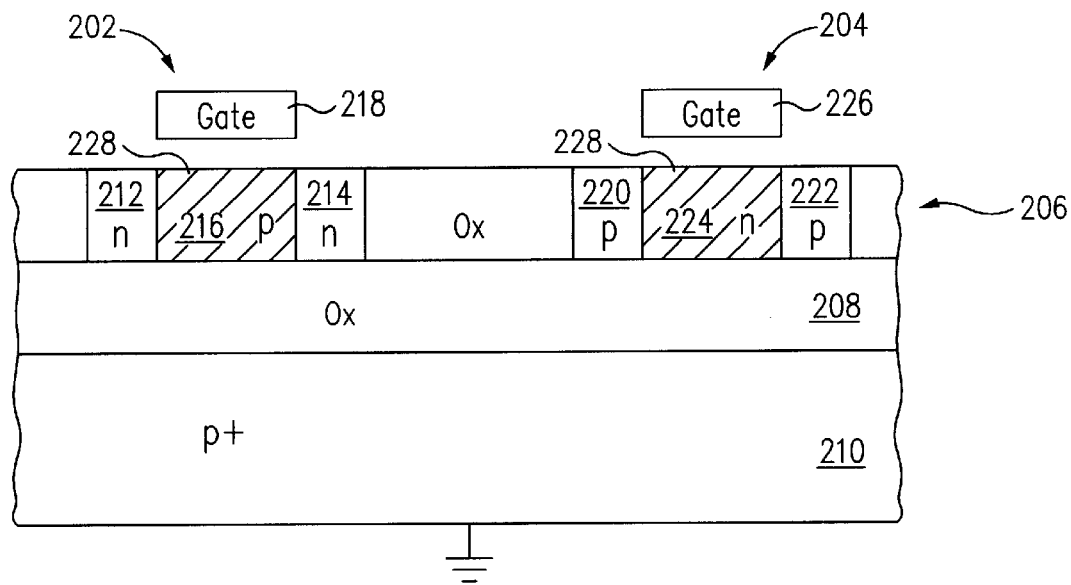
FIG. 2 illustrates a fully depleted SOI structure.
Figure 3:
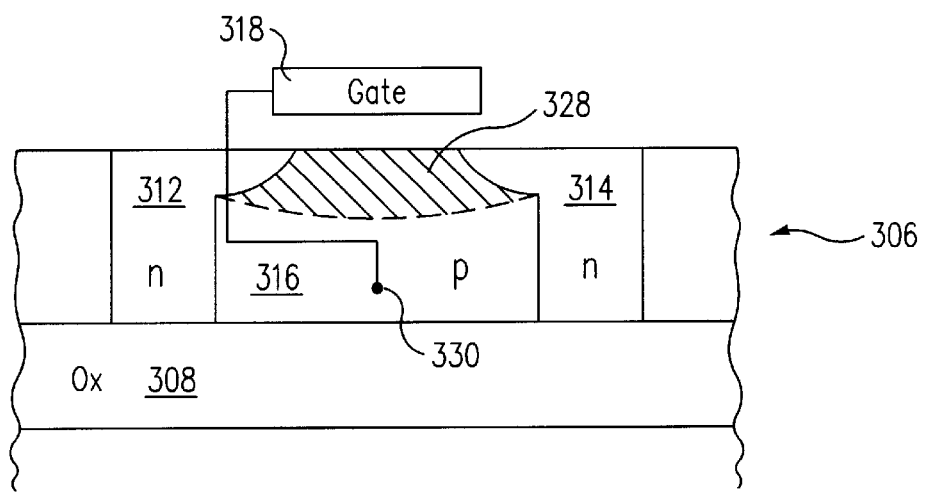
FIG. 3 illustrates a partially depleted dynamic threshold SOI structure.
Figure 4:
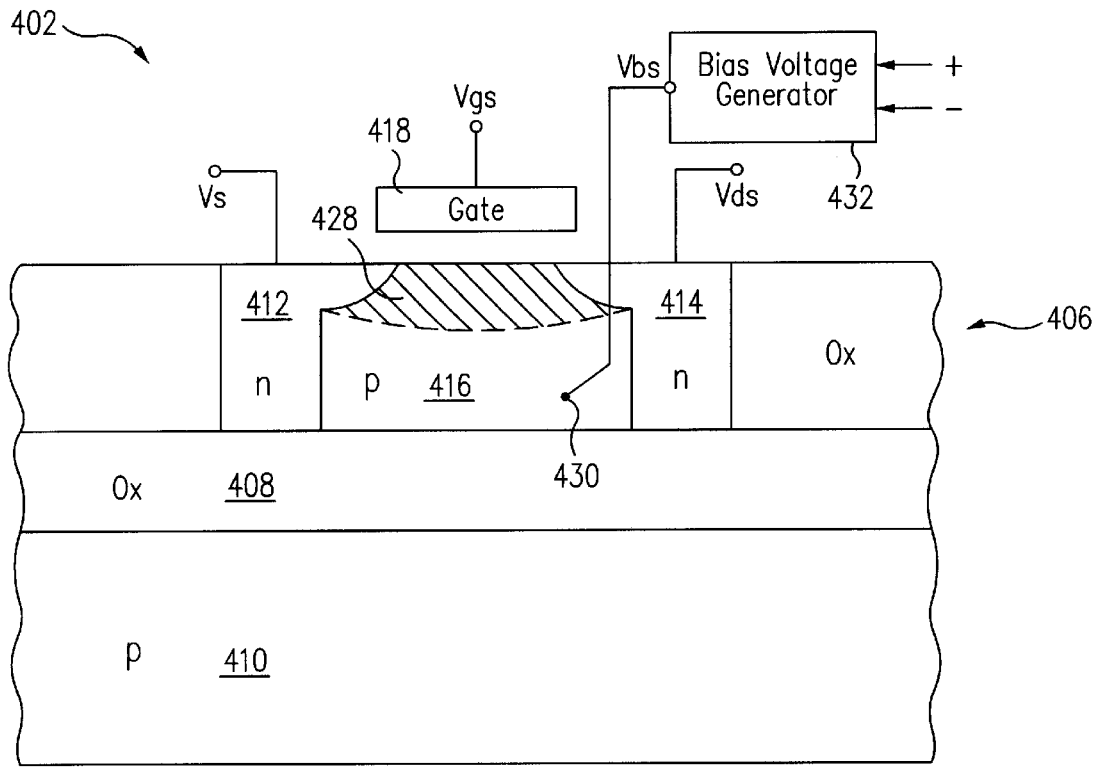
FIG. 4 illustrates a partially depleted SOI structure according to one embodiment of the present invention.

FIG. 4 illustrates a configuration of an exemplary embodiment of the present invention. The partially depleted SOI device shown includes an nfet 402 formed within a layer 406. The layer 406 is located along an insulating layer 408 (e.g., an oxide layer) formed atop a p bulk material 410. The nfet 402 includes source and drain n-regions 412 and 414, a p-region 416, and a gate electrode 418. The layer 406 is of sufficient thickness and the n-regions 412 and 414 are appropriately configured (e.g., through use of source-drain extensions) such that the depletion region 428 is spaced from the upper surface of the oxide layer 408, i.e., only a portion of the p-region 416 is depleted.

A conductive body contact 430 is embedded in the p-region 416, below the depletion region 428. Somewhere outside the channel region 428, preferably close to a terminal edge of the gate electrode, the contact 430 is brought to the surface for connection to a bias potential generator 432. Thus, as schematically shown, the body contact 432 is electrically tied to the output of a bias voltage generator 430 which generates a substrate bias potential Vbs. In this manner, the bias potential is routed to the bulk of each device by way of the body contact 430.

The substrate bias potential is for tuning the threshold of the partially depleted SOI device, and is isolated from the gate voltage Vgs, the source voltage Vs and the drain voltage Vds. This structure allows for selective biasing of the bulk which in turn allows for tuning of the threshold voltage of the device to compensate for variations in process, temperature and circuit activity. Any of known circuits may be adopted for the bias voltage generator 432, including bringing the bias voltage off-chip to an external biasing circuit. Such circuits are typically employed in the context of traditional CMOS structures, and are used to stabilize the CMOS threshold in the face of temperature and other variations in response to input signals instructing an increase or decrease in Vbs. Also, while FIG. 4 illustrates an nfet device, the invention is equally applicable to pfet devices. In the case where both types of devices are employed in the same chip, separate bias potentials are applied to the nfets and pfets, respectively, thereby tuning the threshold voltage of each device. Also, the chip may be functionally divided into multiple device clusters or zones, in which case separate bias potentials may be applied to each respective cluster or zone.

Figure 5:
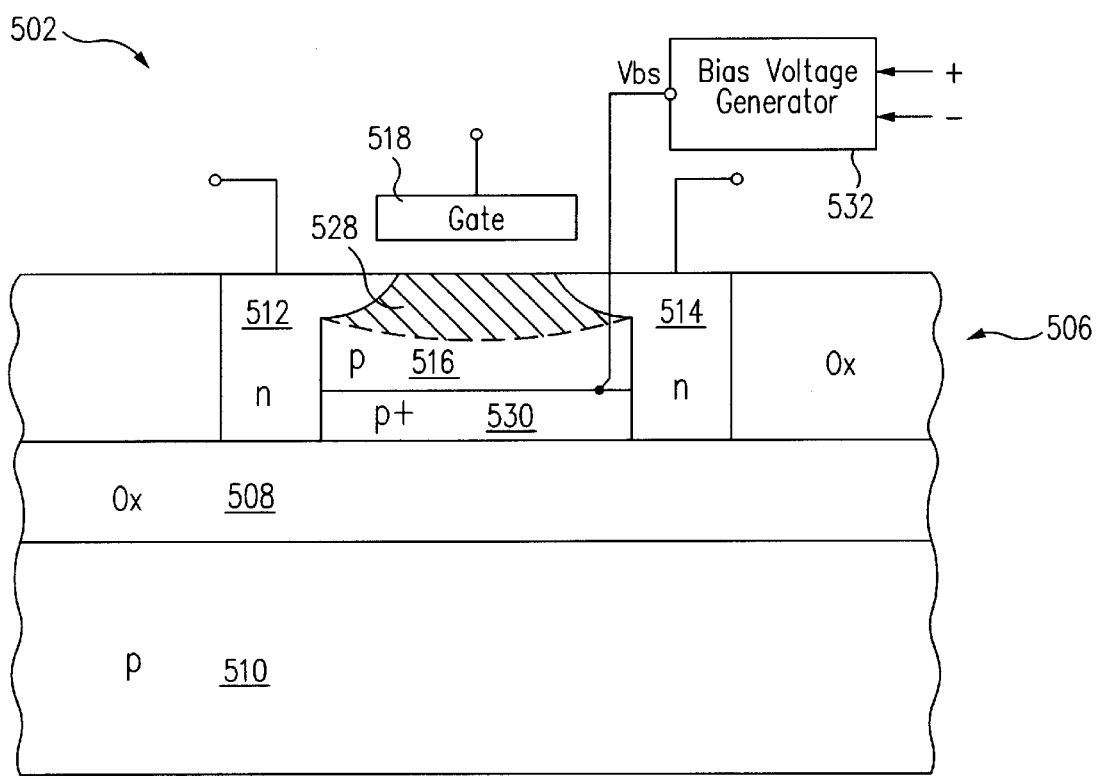
FIG. 5 illustrates a partially depleted SOI structure according to another embodiment of the present invention.

FIG. 5 illustrates another embodiment of the present invention. The partially depleted SOI device shown includes an nfet 502 formed within a layer 506. The layer 506 is located along an insulating layer 508 (e.g., an oxide layer) formed atop a p bulk material 510. The nfet 502 includes source and drain n-regions 512 and 514, a p-region 516, and a gate electrode 518. The layer 506 is of sufficient thickness and the n-regions 512 and 514 are appropriately configured (e.g., through us of source-drain extensions) such that the depletion region 528 is spaced from the upper surface of the oxide layer 508, i.e., only a portion of the p-region 516 is depleted.

The configuration of FIG. 5 is distinguished from that of FIG. 4 in that a buried p+layer 530, which may be formed using conventional implantation techniques within the channel region 528, is used in place of the embedded conductive body contact 430. Somewhere outside the channel region 528, preferably close to a terminal edge of the gate electrode, the p+layer 530 is brought to the surface for connection to the bias potential generator 532. In this manner, the bias potential is routed to the bulk of each device by way of the buried p+layer 530. The buried p+layer 530 has the dual advantages of providing contact to the bulk and arresting the growth of the depletion region under a back bias condition.

In both the configuration of FIG. 4 and that of FIG. 5, the embedded body contact and/or the buried p+layer are preferably extended to as many devices as the configuration permits to connect multiple transistor bodies to the same bias potential, thus tuning multiple devices with a single bias voltage generator. Also, as suggested above, transistor populations can be grouped by function to provide multiple back bias domains having separate bias potentials.

The present invention has been described by way of specific exemplary embodiments, and the many features and advantages of the present invention are apparent from the written description. Thus, it is intended that the appended claims cover all such features and advantages of the invention. Further, since numerous modifications and changes will readily occur to those skilled in the art, it is not desired to limit the invention to the exact construction and operation as illustrated and described. Hence all suitable modifications and equivalents may be resorted to as falling within the scope of the invention.

What is claimed is:

1. A semiconductor device comprising:

a partially depleted SOI device including (a) a semiconductor substrate, (b) an insulating layer formed along a surface of said semiconductor substrate, and (c) a transistor formed on said insulating layer such that said insulating layer is interposed between said transistor and said semiconductor substrate, said transistor including source and drain regions of a first conductivity type formed on said insulating layer, an intermediate region of a second conductivity type formed on said insulating layer and between said source and drain regions, and a gate electrode aligned over said intermediate region, wherein said intermediate region includes a depletion region defining a channel of said transistor and a non-depletion region defining a bulk of said transistor;

first, second, third and fourth terminals electrically coupled to said source region, said drain region, said gate electrode and said bulk, respectively; and, a bias voltage generator, said bias voltage generator selectively supplying a single selected bias voltage directly to said fourth terminal wherein said fourth terminal is isolated from said first through third terminals and further wherein:

said bias voltage is supplied directly to said fourth terminal and said bulk of said transistor to tune a threshold voltage of said transistor of said partially depleted SOI device to account for variations in the processing of said partially depleted SOI device, the temperature of said partially depleted SOI device and the activity of said partially depleted SOI device.

2. A semiconductor device as claimed in claim 1, further comprising a conductive body contact embedded in said bulk and connected to said fourth terminal.

3. A semiconductor device as claimed in claim 2, wherein said partially depleted SOI device is located on a semiconductor chip, and wherein said bias voltage generator is located off said semiconductor chip.

4. A semiconductor device as claimed in claim 2, further comprising a plurality of said partially depleted SOI devices on a semiconductor chip, wherein said plurality of partially depleted SOI devices are functionally divided on said semiconductor chip to define a plurality of domains on said semiconductor chip, and wherein said semiconductor device further includes a plurality of said bias voltage generators for said respective domains.

5. A semiconductor device as claimed in claim 4, wherein at least one of said plurality of bias voltage generators is located off said semiconductor chip.

6. A semiconductor device as claimed in claim 1, further comprising a conductive layer of the second conductivity type contained within said bulk and connected to said fourth terminal.

7. A semiconductor device as claimed in claim 6, wherein said partially depleted SOI device is located on a semiconductor chip, and wherein said bias voltage generator is located off said semiconductor chip.

8. A semiconductor device as claimed in claim 6, further comprising a plurality of said partially depleted SOI devices on a semiconductor chip, wherein said plurality of partially depleted SOI devices are functionally divided on said semiconductor chip to define a plurality of domains on said semiconductor chip, and wherein said semiconductor device further includes a plurality of said bias voltage generators for said respective domains.

9. A semiconductor device as claimed in claim 8, wherein at least one of said plurality of bias voltage generators is located off said semiconductor chip.

10. A semiconductor device as claimed in claim 1, wherein said partially depleted SOI device is located on a semiconductor chip, and wherein said bias voltage generator is located off said semiconductor chip.

11. A semiconductor device as claimed in claim 1, further comprising a plurality of said partially depleted SOI devices on a semiconductor chip, wherein said plurality of partially depleted SOI devices are functionally divided on said semiconductor chip to define a plurality of domains on said semiconductor chip, and wherein said semiconductor device further includes a plurality of said bias voltage generators for said respective domains.

12. A semiconductor device as claimed in claim 11, wherein at least one of said plurality of bias voltage generators is located off said semiconductor chip.

* * * * *